(12) United States Patent
Honcharenko

(10) Patent No.: US 8,099,056 B2
(45) Date of Patent: Jan. 17, 2012

(54) DIGITAL HYBRID AMPLIFIER CALIBRATION AND COMPENSATION METHOD

(75) Inventor: Walter Honcharenko, Monmouth Junction, NJ (US)

(73) Assignee: Alcatel Lucent, Paris (FR)

( * ) Notice: Subject to any disclaimer, the term of this patent is extended or adjusted under 35 U.S.C. 154(b) by 428 days.

(21) Appl. No.: 12/453,586

(22) Filed: May 15, 2009

(65) Prior Publication Data

US 2010/0289569 A1     Nov. 18, 2010

(51) Int. Cl.
*H04B 17/00*     (2006.01)
(52) U.S. Cl. .................................... 455/67.11
(58) Field of Classification Search ............. None
See application file for complete search history.

(56) References Cited

U.S. PATENT DOCUMENTS

| | | |
|---|---|---|
| 5,834,972 A | 11/1998 | Schiemenz, Jr. et al. |
| 6,006,111 A | 12/1999 | Rowland |
| 7,088,173 B1 | 8/2006 | Rozario et al. |
| 2003/0214355 A1 | 11/2003 | Luz et al. |
| 2008/0143562 A1 | 6/2008 | Huang et al. |

FOREIGN PATENT DOCUMENTS

WO   WO 2005/029875   9/2004

OTHER PUBLICATIONS

International Search Report and Written Opinion of the International Searching Authority, mailed Sep. 15, 2010.

*Primary Examiner* — Lincoln Donovan
*Assistant Examiner* — Sibin Chen
(74) *Attorney, Agent, or Firm* — Harness, Dickey & Pierce, P.L.C.

(57) ABSTRACT

Methods and hybrid matrix amplifiers are provided. In a method of calibrating a hybrid matrix amplifier of a wireless transceiver, a plurality of signal paths having a digital and an analog portion are toggled such that the analog portion of each of the plurality of signal paths is active only during a corresponding buffer capture interval of a calibration process. The signal paths carry signals to be transmitted by an antenna arrangement. Channel estimates for each of the plurality of signal paths are generated based only on sampling data collected during the corresponding buffer capture interval. The hybrid matrix amplifier is calibrated based on the generated channel estimates.

15 Claims, 3 Drawing Sheets

DIGITAL HYBRID AMPLIFIER CALIBRATION AND COMPENSATION METHOD

BACKGROUND OF THE INVENTION

1. Field

Example embodiments relate to hybrid matrix amplifiers and methods for calibrating the same.

2. Description of the Conventional Art

Conventionally, wireless transmitters at base stations and mobile stations include hybrid (or Butler) matrix amplifiers. Hybrid matrix amplifiers allow for signal paths to share the same amplifier resources, while meeting isolation requirements across output ports. Hybrid matrix amplifiers are generally well-known.

Prior to or during operation, hybrid matrix amplifiers must be calibrated to maintain output port isolation. Conventionally, a hybrid matrix amplifier is calibrated by periodically transmitting a training signal. But, transmission of training signals is undesirable because training signals are not compliant with regulatory (e.g., Federal Communications Commission (FCC), European Telecommunications Standards Institute (ETSI), $3^{rd}$ Generation Partnership Project (3GPP), etc.) emissions designators.

Moreover, during transmission of training signals, normal traffic signals are interrupted, which may cause service outages.

Transmission of training signals also increases overall system interference levels in neighboring radio coverage areas, which may cause additional outages. Additional hardware and firmware is also required to generate the training signals.

SUMMARY OF THE INVENTION

According to at least one example embodiment, each of a plurality of input signals is gated or toggled on/off such that only one signal path is active and present on all the output ports of an analog hybrid matrix unit at any one time. A single observation receiver samples the output of each port separately. And, for each port, a receiving buffer capture unit captures the time domain signal, which is comprised of the multiple gated signals or samples. A channel estimate or an inverse channel estimate is then computed based on the samples. The channel estimate or inverse channel estimate is used to compute required digital filters and/or digital equalizers to form an inverse response of the analog hybrid matrix amplifier.

Methods according to example embodiments estimate gain and phase imbalance in a multiport analog hybrid matrix amplifier. Example embodiments also provide a digital signal processing solution to separate multiple signals onto the multiple outputs while meeting the isolation requirements between output ports with only a single observation receiver. Example embodiments do not require the use of training signals or interruption of normal communication traffic for calibration.

At least one example embodiment provides a method of calibrating a hybrid matrix amplifier of a wireless transceiver. A plurality of signal paths having a digital and an analog portion are toggled such that the analog portion of each of the plurality of signal paths is active only during a corresponding buffer capture interval of a calibration process. The signal paths carry signals to be transmitted by an antenna arrangement, and the buffer capture intervals corresponding to each signal path do not overlap. Channel estimates for each of the plurality of signal paths are generated, and the hybrid matrix amplifier is calibrated based on the generated channel estimates. The channel estimate for each signal path is generated based only on sampling data collected during the corresponding buffer capture interval.

In another embodiment, each of a plurality of signal paths having a digital and an analog portion are isolated such that the analog portion of each of the plurality of signal paths is active only during a corresponding buffer capture interval of a calibration process. The signal paths carry signals to be transmitted by an antenna arrangement, and the buffer capture intervals corresponding to each signal path do not overlap. Channel estimates for each of the plurality of signal paths are generated based only on sampling data collected during the corresponding buffer capture interval. The hybrid matrix amplifier is calibrated based on the generated channel estimates.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF THE EMBODIMENTS

Example embodiments provide a hybrid matrix amplifier arrangement and methods for calibrating the same without the need to transmit training signals. Thus, example embodiments do not require the use of training signals or interruption of normal communication traffic.

Example embodiments are described as apparatuses depicted as block diagrams and processes or methods depicted as flowcharts. Although the flowcharts describe the operations as sequential processes, at least some of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods and apparatuses illustrated by the flow charts and block diagrams discussed below may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

As disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" may include, but is not limited to, portable or fixed storage devices, optical storage devices, and various other mediums capable of storing and/or containing instruction(s) and/or data.

A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Figure 1:
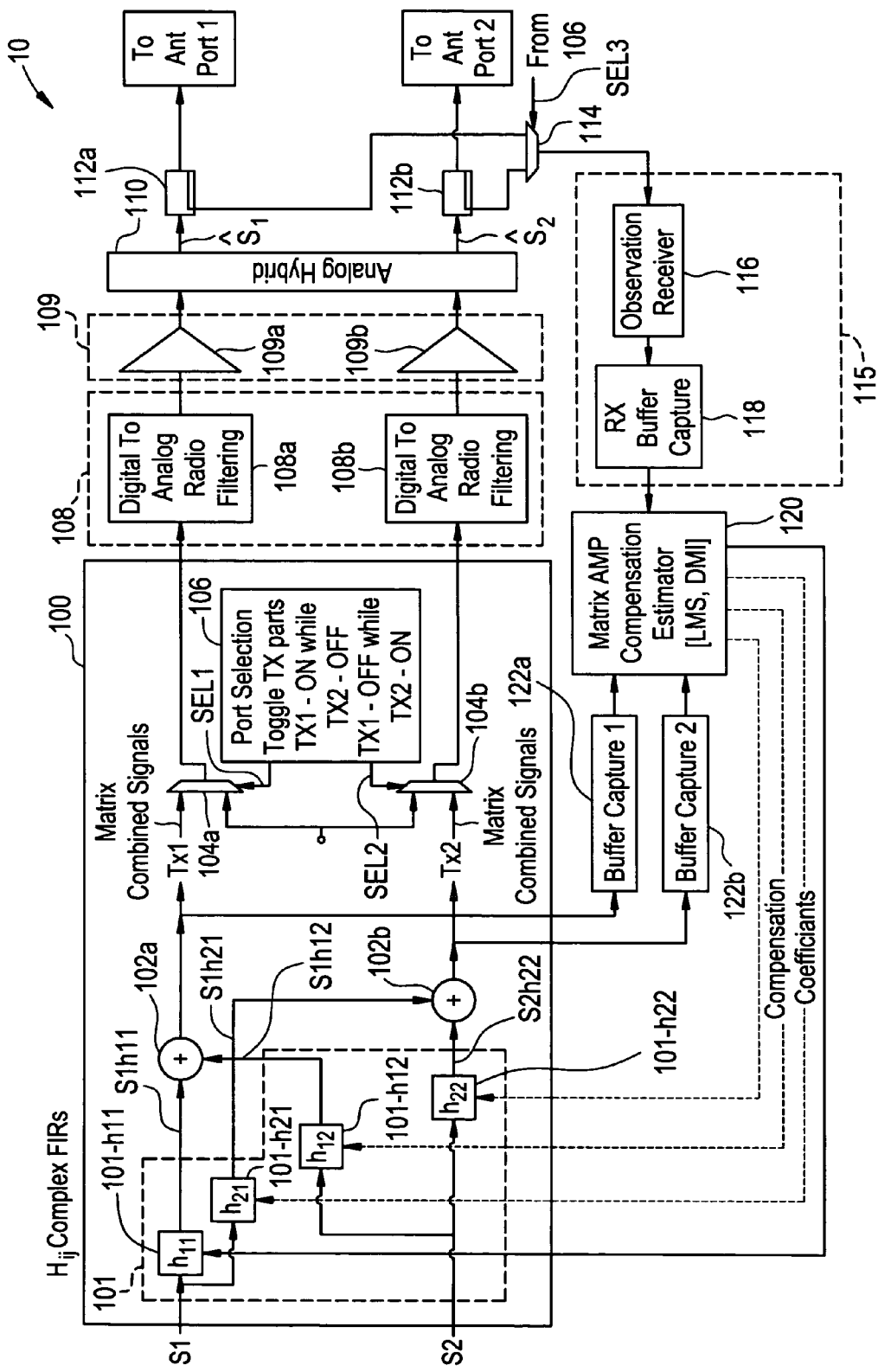
FIG. 1 illustrates a hybrid matrix amplifier according to an example embodiment.

FIG. 1 illustrates an example embodiment of a hybrid matrix amplifier. The hybrid matrix amplifier 10 in FIG. 1 is illustrated as including various modules or blocks, some of which may represent module structures within a processor, field programmable gate array (FPGA), application specific integrated circuit (ASIC), etc., thereby rendering that computing structure a special purpose, structured computer or processor, rather than a general purpose computer or processor. In one example, at least some of the modules or blocks in the block diagram shown in FIG. 1 may constitute a separate module portion or hardware component in a radio-frequency component (e.g., a base station and/or mobile station) of a wireless network.

The hybrid matrix amplifier 10 shown in FIG. 1 is a two-port hybrid matrix amplifier. The hybrid matrix amplifier 10 combines digital input traffic signals S1 and S2 and outputs the combined signals to multiple antennas for transmission. Signals S1 and S2 are digitally sampled signals typical of communication systems comprised of complex (real or imaginary or I and Q) samples.

The hybrid matrix amplifier 10 shown in FIG. 1 is capable of performing all functions of a conventional hybrid matrix amplifier during normal operation. Because these functions are well-known, a detailed discussion is omitted. In addition to these conventional functions, the hybrid matrix amplifier 10 is also configured to be calibrated without the use of training signals. Calibration methods according to example embodiments will be discussed in more detail later with regard to FIG. 3.

Although example embodiments will be discussed with regard to the two-port hybrid matrix amplifier 10 shown in FIG. 1, example embodiments are applicable to multi-port hybrid matrix amplifiers having more than two inputs and outputs.

Referring to FIG. 1, the hybrid matrix amplifier 10 includes a digital phase combiner 100. The digital phase combiner 100 is configured to generate digital matrix combined signals TX1 and TX2 based on digital input signals S1 and S2.

In more detail, as shown in FIG. 1 the digital phase combiner includes a filter bank 101. The filter bank 101 includes a plurality of complex (real and imaginary or I and Q) filters 101_h11, 101_h21, 101_h12, and 101_h22. The filters 101_h11, 101_h21, 101_h12, and 101_h22 are digital Finite Impulse Response (FIR) filters that form the inverse of the analog matrix hybrid unit 110 discussed in more detail later. More specifically, the complex filters 101_h11, 101_h21, 101_h12, and 101_h22 are multi-tap, tapped delay line digital filters that provide gain and phase compensation across a frequency band of interest. Each filter $h_{bb}$ applies a set (vector) of complex compensation coefficients from a filter compensation matrix H. Hereinafter, the set of complex compensation coefficients $h_{bb}$ is referred to as a compensation filter. In the hybrid matrix amplifier 10 in FIG. 1, the filter compensation matrix H may be given by the matrix shown below.

$$H = \begin{bmatrix} h_{11} & h_{12} \\ h_{21} & h_{22} \end{bmatrix}$$

The filter compensation matrix H may be provided by a matrix compensation estimator 120 as discussed in more detail later.

The number of taps, bit widths, etc. of the filter bank 101 may be chosen to accommodate the signal bandwidth, delay variation, gain variation, and phase variation that may be present in the analog portion of the signal paths PATH1 and PATH2. As discussed herein, signal paths PATH1 and PATH2 refer to the combination of the digital paths within the digital phase combiner 100 as well as the analog portion of the signal paths PATH1 and PATH2 traversed by the matrix combined signals output from the digital phase combiner 100. The analog portion of the signal paths extends from the RF processing circuitry 108 through the analog hybrid matrix unit 110.

Referring back to FIG. 1, filters 101_h11 and 101_h21 filter digital input signal S1 based on compensation filters $h_{11}$ and $h_{21}$, respectively. Filter 101_h11 outputs the filtered digital signal S1$h$11 to a first adder 102a. Filter 101_h21 outputs the filtered signal S1$h$21 to the second adder 102b.

Filters 101_h12 and 101_h22 filter digital input signal S2 based on respective compensation filters $h_{12}$ and $h_{22}$. Filter 101_h12 outputs the filtered digital signal S2$h$12 to a first adder 102a. Filter 101_h22 outputs the filtered signal S2$h$22 to the second adder 102b.

Returning to FIG. 1, the first adder 102a sums the filtered digital signals S1$h$11 and S2$h$12 to generate the first digital matrix combined signal TX1. The first adder 102a outputs the first digital matrix combined signal TX1 along the digital portion of the first signal path PATH1 to a first multiplexer 104a. The first adder 102a also outputs the first digital matrix combined signal TX1 to a first buffer capture unit 122a. The first buffer capture unit 122a is configured to store a set of n samples of the first digital matrix combined signal TX1. The first buffer capture unit 122a may be any suitable buffer memory.

The second adder 102b sums the filtered digital signals S2$h$21 and S2$h$22 to generate the second digital matrix combined signal TX2. The second adder 102b outputs the second digital matrix combined signal TX2 along the digital portion of the second signal path PATH2 to a second multiplexer 104b. The second adder 102b also outputs the second digital matrix combined signal TX2 to a second buffer capture unit 122b. The second buffer capture unit 122b stores a set of n samples of the second digital matrix combined signal TX2. The second buffer capture unit 122b may be any suitable buffer memory.

Each of the first and second multiplexers 104a and 104b receives a respective one of the first and second digital matrix combined signals TX1 and TX2 as well as a null or 0 signal. During normal operation, the multiplexers 104a and 104b continuously output respective digital matrix combined signals TX1 and TX2. However, during a calibration process a port selection unit 106 controls the first and second multiplexers 104a and 104b such that only one of digital matrix combined signals TX1 and TX2 is active during a given buffer capture interval. The port selection unit 106 controls the multiplexers 104a and 104b using respective selection signals SEL1 and SEL2. As noted above, the calibration process will be described in more detail later with regard to FIG. 3.

Returning to FIG. 1, the first and second multiplexers 104a and 104b output the first digital matrix combined signal TX1 and the second digital matrix combined signal TX2, respectively, to radio frequency (RF) processing circuitry 108.

The RF processing circuitry 108 includes a first digital-to-analog radio filter unit 108a and a second digital-to-analog radio filter unit 108b.

The first digital-to-analog radio filter unit 108a filters the first digital matrix combined signal TX1 and converts the filtered first digital matrix combined signal TX1 to an analog signal (referred to herein as a first analog signal). The first digital-to-analog radio filter 108a then up converts the first analog signal, and outputs the resultant first analog signal to amplifier unit 109. Because methods and processes for filtering, digital-to-analog conversion and up-conversion are well-known, a detailed discussion is omitted.

The second digital-to-analog radio filter 108b processes the second digital matrix combined signal TX2 in the same manner as the first digital matrix combined signal TX1 to generate a second analog signal. The second analog signal is also output to amplifier unit 109.

The amplifier unit 109 includes a plurality of amplifiers 109a and 109b. The first amplifier 109a amplifies the received first analog signal and outputs the amplified first analog signal to the analog hybrid matrix unit 110. Similarly, the second amplifier 109b amplifies the received second analog signal and outputs the same to the analog hybrid matrix unit 110.

The analog hybrid matrix unit 110 combines the first and second analog signals to generate a plurality of analog matrix combined output signals to be transmitted by antennas coupled to antenna ports Ant Port 1 and Ant Port 2. A more detailed discussion of the analog hybrid matrix unit 110 will be provided with respect to FIG. 2.

Figure 2:
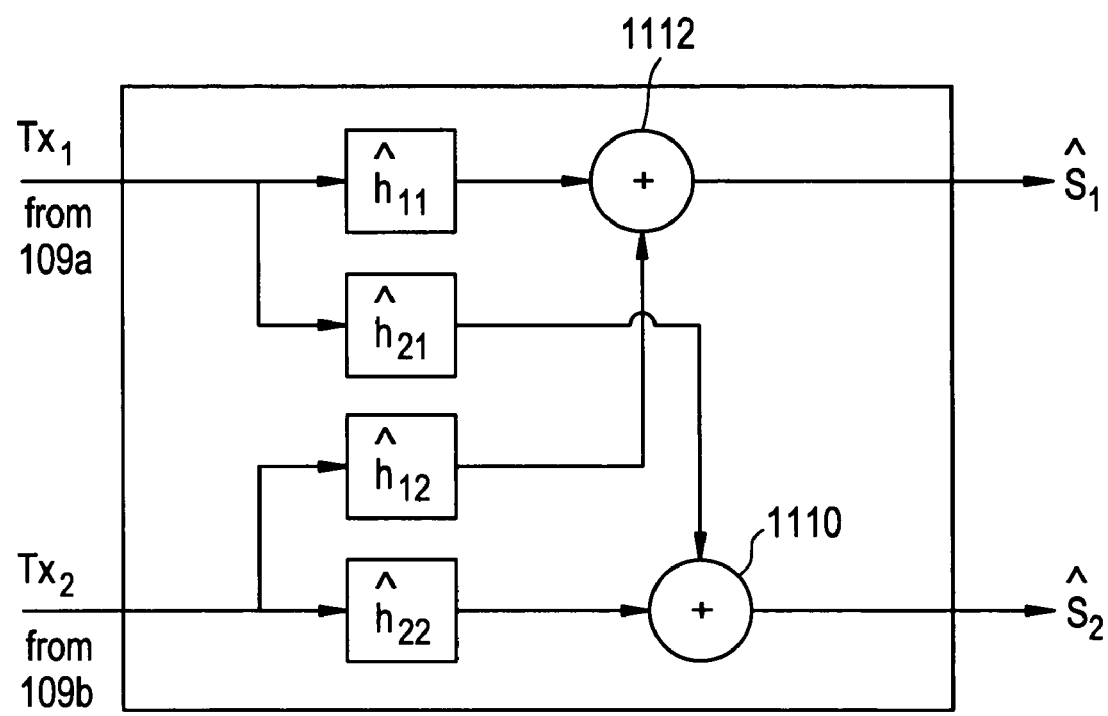
FIG. 2 illustrates an analog hybrid matrix unit according to an example embodiment.

FIG. 2 illustrates the analog hybrid matrix unit 110 in more detail.

As shown in FIG. 2, the analog hybrid matrix unit 110 includes analog path transfer functions $\hat{h}_{11}$, $\hat{h}_{21}$, $\hat{h}_{12}$ and $\hat{h}_{22}$ and combiners 1110 and 1112. However, the analog hybrid matrix unit 110 may include additional transfer functions and combiners depending on the number of ports and paths in the hybrid matrix amplifier arrangement.

As shown in FIG. 2, analog path transfer functions $\hat{h}_{11}$ and $\hat{h}_{21}$ are applied to the first analog signal from amplifier 109a. The result of the applied transfer function $\hat{h}_{11}$ is output to combiner 1112, whereas the result of the transfer function $\hat{h}_{21}$ is output to combiner 1110.

As shown in FIG. 2, analog path transfer functions $\hat{h}_{12}$ and $\hat{h}_{22}$ are applied to the second analog signal from amplifier 109b. The result of the applied transfer function $\hat{h}_{12}$ is output to combiner 1112, whereas the result of the transfer function $\hat{h}_{22}$ is output to combiner 1110.

The combiner 1112 combines the received resultant analog signals to generate a first analog matrix combined output signal $\hat{S}_1$. The combiner 1112 outputs the first analog matrix combined output signal $\hat{S}_1$ to a coupler 112a.

The combiner 1110 combines the received resultant analog signals to generate a second analog matrix combined output signal $\hat{S}_2$. The combiner 1110 outputs the second analog matrix combined output signal $\hat{S}_2$ to a coupler 112b.

Returning to FIG. 1, the couplers 112a and 112b output the first and second analog matrix combined output signals $\hat{S}_1$ and $\hat{S}_2$ to respective antenna ports Ant Port 1 and Ant Port 2 as well as an RF switch 114.

During a calibration process discussed in more detail later, the RF switch 114 alternately outputs one of the first and second analog matrix combined output signals $\hat{S}_1$ and $\hat{S}_2$ based on a selection signal SEL3 from the port selection unit 106.

The signals output from the RF switch 114 are sampled, and the samples are stored by a sampling unit 115.

In more detail, at the sampling unit 115 an observation receiver 116 down-converts and digitizes the analog matrix combined output signal (e.g., either $\hat{S}_1$ or $\hat{S}_2$ depending on which is being output) received from the RF switch 114. The observation receiver 116 outputs the digitized signal to the receiving (Rx) buffer capture unit 118. The receiving buffer capture unit 118 stores a set of n samples of the received digitized down-converted signal. The number of samples n in the set is chosen to be large enough to provide a channel estimate that provides adequate isolation across the signal paths PATH1 and PATH2. The number of samples n stored at the first and second buffer capture units 122a and 122b may be the same as the number of samples n stored at the receiving buffer capture 118.

In one example, the number of samples n may be 8 k, 16 bit IQ samples at 92.16 MHz, which corresponds to a receiving buffer capture time (buffer capture interval length) of 8192/92.16 or about 88.89 microseconds, and a system calibration time (calibration interval length) of about two times the receiving buffer capture time (about 177.78 microseconds). Of the n samples stored at the receiving buffer capture unit 118, a first n/2 samples correspond to the first analog matrix combined output signal $\hat{S}_1$ and a subsequent n/2 samples correspond to the second analog matrix combined output signal $\hat{S}_2$.

Still referring to FIG. 1, the hybrid matrix amplifier 10 further includes a matrix compensation estimator 120 coupled to the receiving buffer capture unit 118 and the buffer capture units 122a and 122b. The matrix compensation estimator 120 generates channel estimates based on the sets of samples stored in the buffer capture units 122a and 122b and the receiving buffer capture unit 118. The matrix compensation estimator 120 may be any known channel estimation unit (e.g., an least mean squares (LMS), direct matrix inversion (DMI), recursive least squares (RLS), etc.) In one example, the matrix compensation estimator 120 generates filter compensation matrix H including compensation filters $h_{11}$, $h_{21}$, $h_{12}$ and $h_{22}$ for the filter bank 101. The matrix compensation estimator 120 then outputs the filter compensation matrix H to the filter bank 101 at the conclusion of the calibration process.

The above-described hybrid matrix amplifier 10 may be calibrated using methods according to example embodiments. The calibration process may be performed without the need to transmit training signals.

Figure 3:
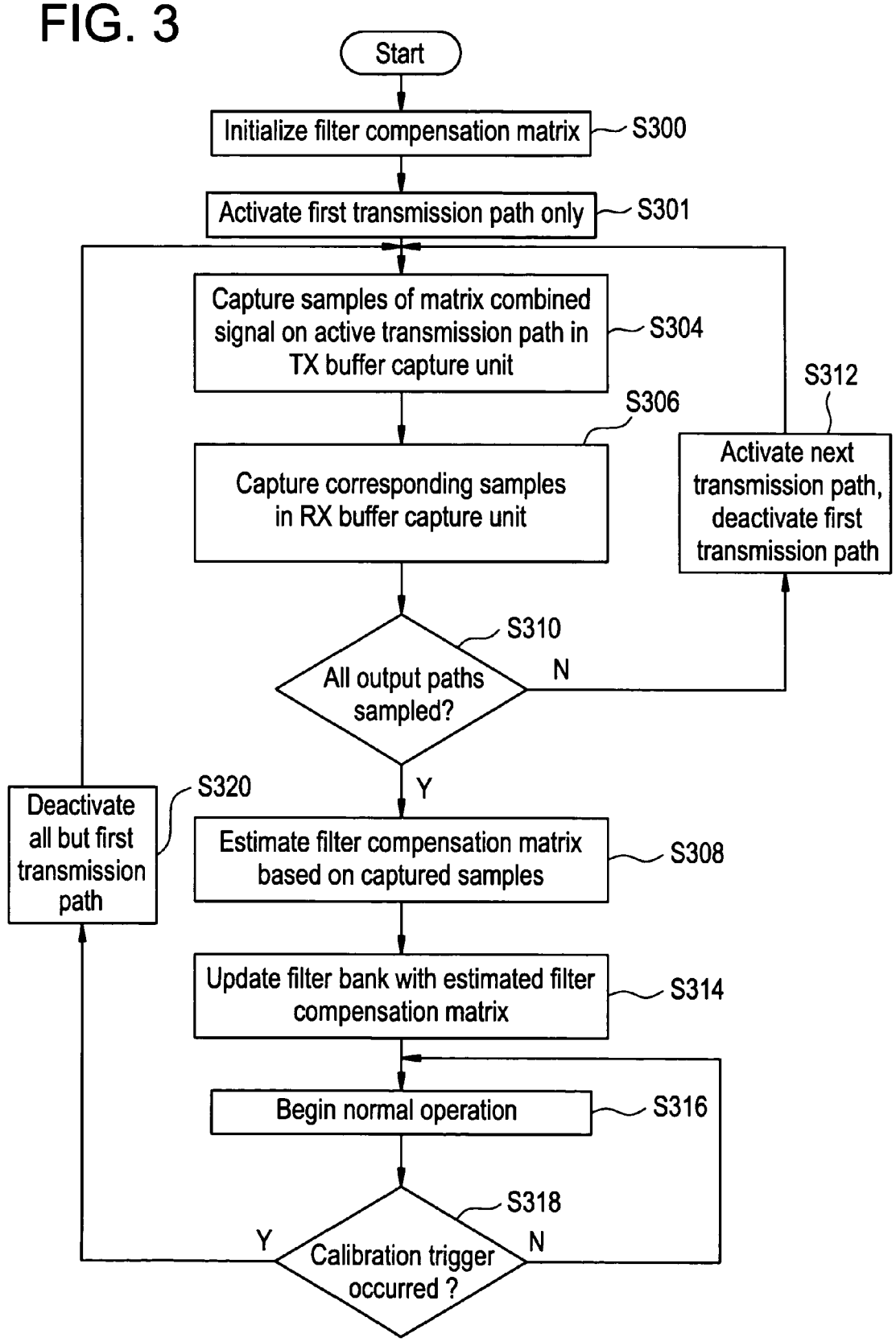
FIG. 3 illustrates a method for calibrating a hybrid matrix amplifier according to an example embodiment.

FIG. 3 is a flow chart illustrating a calibration method according to an example embodiment. The method shown in FIG. 3 will be described with regard to the hybrid matrix amplifier 10 shown in FIG. 1. However, methods according to example embodiments may be applicable to other hybrid matrix amplifiers, for example, hybrid matrix amplifiers having more than two ports.

Referring to FIG. 3, at step S300 the filter compensation matrix H is initialized such that compensation filters $h_{11}$ and $h_{22}$ provide unity gain and 0 phase, and such that compensation filters $h_{21}$ and $h_{12}$ are 0. That is, for example, the filter compensation matrix H initialized as shown below:

$$\tilde{H}(f) = \begin{bmatrix} H_{11}(f) & H_{12}(f) \\ H_{21}(f) & H_{22}(f) \end{bmatrix} = \begin{bmatrix} 1 & 0 \\ 0 & 1 \end{bmatrix}.$$

In the above-equation, $\tilde{H}(f)$ is the frequency response H and $\tilde{H}_{bb}(f)$ represents the frequency response of the filters $h_{bb}$.

After initialization, the port selection unit 106 begins toggling between signal paths PATH1 and PATH2 such that only one signal path is active during a given buffer capture interval. According to example embodiments, a calibration interval is a time period during which an iteration of the calibration process is performed. As noted above, in one example the calibration interval is equal to the system calibration time, which is about two times the buffer capture time or about 177.78 microseconds. The calibration interval includes a plurality of buffer capture intervals, which do not overlap one another. The number of buffer capture intervals in the calibration interval may be equal to the number of signal paths in the hybrid matrix amplifier. With respect to the hybrid matrix amplifier 10 in FIG. 1, the calibration interval includes two buffer capture intervals.

The toggling between signal paths PATH1 and PATH2 isolates the output signal paths such that the hybrid matrix amplifier 10 is able to determine the influence of the analog hybrid matrix unit 110 on the isolated path. In other words, because only first digital matrix combined signal TX1 is active (being output from the digital phase combiner 100), the analog matrix combined output signals $\hat{S}_1$ and $\hat{S}_2$ from the analog hybrid unit 110 do not include signal components of the second digital matrix combined signal TX2 as would be the case if both the first and second digital matrix combined signals TX1 and TX2 were being output from the digital phase combiner 100. Accordingly, the analog matrix combined output signals $\hat{S}_1$ and $\hat{S}_2$ from the analog hybrid matrix unit 110 are indicative of the influence of the analog hybrid matrix unit 110 on the first digital matrix combined signal TX1 or first signal path PATH1.

As discussed above, the calibration process shown in FIG. 3 is performed during a calibration interval. During the calibration interval, each signal path (e.g., PATH1 and PATH2) is active for a given buffer capture interval. As discussed herein, a signal path is active when the corresponding digital matrix combined signal is output on the signal path. For example, the first signal path PATH1 is active when the first digital matrix combined signal TX1 is being output from the digital phase combiner 100. As discussed above, the buffer capture interval or buffer capture time corresponds to the number of samples n stored in the buffer capture units 122a, 122b, and the receiving buffer capture unit 118. In one example, a buffer capture interval may be about 88.89 microseconds.

Returning to FIG. 3, at start-up of a wireless transceiver, (at step S301) the port selection unit 106 activates only the first signal path PATH1. The first signal path PATH1 remains active for a first buffer capture interval of the calibration process. After the port selection unit 106 activates the first signal path PATH1, the digital phase combiner 100 triggers capture of n samples of the first digital matrix combined signal TX1 by the buffer capture unit 122a at step S304.

After the first digital matrix combined signal TX1 is processed (at RF processing unit 108), amplified (at amplifier unit 109) and combined with the null or 0 signal on the deactivated second signal path TX2 (at analog hybrid matrix unit 110) to generate first and second analog matrix combined output signals $\hat{S}_1$ and $\hat{S}_2$, samples of the first and second analog matrix combined output signals $\hat{S}_1$ and $\hat{S}_2$ are captured by the sampling unit 115 at step S306.

In more detail, the first and second analog matrix combined output signals $\hat{S}_1$ and $\hat{S}_2$ are output alternately by the RF switch 114 to the sampling unit 115 in response to the selection signal SEL3 from the port selection unit 106. In one example, the first analog matrix combined output signal $\hat{S}_1$ is output for a first portion of the buffer capture interval and the second analog matrix combined output signal $\hat{S}_2$ is output for a subsequent second portion of the buffer capture interval. In this example, each portion of the buffer capture interval comprises half (or about half) of the buffer capture interval during which the first signal path PATH1 is active.

After being down-converted and digitized by the observation receiver 116, the receiving buffer capture 118 stores the captured set of n samples of the received digitized and down-converted signal from the observation receiver 116. The receiving buffer capture unit 118 may be the size of the combination of the buffer capture units 122a and 122b. For example, if each of buffer capture units 122a and 122b store n samples, the receiving buffer capture unit 118 is capable of storing 2n samples. Each set of n samples stored in the receiving buffer capture 118 corresponds to (is time aligned with) a set of n samples stored in the buffer capture 122a. The receiving buffer capture unit 118 may also be any suitable buffer memory.

At step S310, the hybrid matrix amplifier 10 determines whether all the signal paths have been considered (sampled). If all paths have not been sampled, the port selection unit 106 activates the second signal path PATH2 and deactivates the first signal path PATH1 at step S312. The process then returns to step S304 and repeats the above-described process with respect to signal path PATH2 during a subsequent second buffer capture interval.

Returning to step S310, if all the signal paths have been sampled, at step S308 the matrix compensation estimator 120 generates channel estimates (e.g., filter compensation matrix H discussed above) based on a comparison between sets of n time-aligned samples stored in each of the receiving buffer capture 118 and the capture buffer units 122a and 122b.

Each of the compensation filters to be estimated has time, phase and gain offsets with respect to each other. To preserve gain, phase and delay of each of the compensation filters with respect to each other, the captured samples are time and phase aligned such that one path is the reference, and the other paths are aligned using the same time, phase and gain reference used for the reference path. Any phase, gain and/or delay compensation is then accomplished through the estimation of the compensation filters.

For example, in comparing a first set of n/2 samples in the buffer capture unit 122a with the first n/2 samples in the receiving buffer capture unit 118, the matrix compensation estimator 120 extracts a time, gain and phase, which is then used as a reference in comparing the other sets of samples in the receiving buffer capture unit 118 and the buffer capture units 122a and 122b. The time, gain and phase may be extracted in any well-known manner.

The matrix compensation estimator 120 may be any known channel estimation unit. In one example, the matrix compensation estimator 120 compares a first set of n samples from the receiving buffer unit 118 and the set of n samples from the buffer capture 122a, and compares a second (subsequent) set of n samples with the set of n samples from the buffer capture unit 122b to generate compensation filters $h_{11}$, $h_{21}$, $h_{12}$, and $h_{22}$, which comprise the filter compensation matrix H. The generated compensation filters $h_{11}$, $h_{21}$, $h_{12}$, $h_{22}$, and resultant filter compensation matrix H is/are the inverse of the analog path transfer functions $\hat{h}_{11}$, $\hat{h}_{21}$, $\hat{h}_{12}$, $\hat{h}_{22}$, and $\hat{H}$, respectively, such that $H\hat{H}$ approaches $$\begin{bmatrix} g & 0 \\ 0 & g \end{bmatrix},$$

where g is an arbitrary system gain.

At step S314, the matrix compensation estimator 120 then outputs the generated filter compensation matrix H to the corresponding filters in the filter bank 101.

The hybrid matrix amplifier 10 then begins normal operation at step S316.

During normal operation, the hybrid matrix amplifier 10 may perform the above described calibration process in response to a calibration trigger. The calibration trigger may be expiration of a timer, a temperature change, a transmission power change, or anything that causes analog path drift or variation. Variations in the analog path include variations in analog path characteristics such as gain, phase, transfer characteristics, etc.

If a calibration trigger occurs, the hybrid matrix amplifier arrangement 10 initiates the calibration process, and the port selection unit 106 deactivates all but the first signal path PATH1 at step S320. The process then returns to step S304 and continues as discussed above.

Returning to step S318, the hybrid matrix amplifier arrangement 10 continues normal operation until the calibration trigger occurs. If no calibration trigger occurs, the hybrid matrix amplifier arrangement 10 operates normally.

According to example embodiments, the first and second signal paths PATH1 and PATH2 are toggled (or gated) such that only one of the signal paths is active at any given time during the calibration process. The toggling isolates the output signal paths such that the hybrid matrix amplifier 10 is able to determine the influence of the analog hybrid matrix unit on the isolated path. In other words, because only one of the two distal matrix combined signals is output, the analog matrix combined output signals from the analog hybrid matrix unit do not include signal components of the inactive digital matrix combined signal as is the case during normal operation. Accordingly, the analog matrix combined output signals from the analog hybrid matrix unit 110 are indicative of the influence of the analog hybrid matrix unit 110 on only the first digital matrix combined signal TX1.

The invention being thus described, it will be obvious that the same may be varied in many ways. Such variations are not to be regarded as a departure from the invention, and all such modifications are intended to be included within the scope of the invention.

I claim:

1. A method of calibrating a hybrid matrix amplifier of a wireless transceiver, the method comprising:
    toggling between a plurality of signal paths having a digital and an analog portion such that the analog portion of each of the plurality of signal paths is active only during a corresponding buffer capture interval of a calibration process, the signal paths carrying signals to be transmitted by an antenna arrangement, wherein the buffer capture intervals corresponding to each signal path do not overlap;
    generating channel estimates for each of the plurality of signal paths, the channel estimate for each signal path being generated based only on sampling data collected during the corresponding buffer capture interval; and
    calibrating the hybrid matrix amplifier based on the generated channel estimates.

2. The method of claim 1, wherein the generating step comprises:
    generating a filter compensation matrix including a plurality of compensation filters; and wherein
    the calibrating step calibrates the hybrid matrix amplifier based on the generated filter compensation matrix.

3. The method of claim 1, further comprising:
    filtering a plurality of digital input signals based on a filter compensation matrix; and
    summing the filtered digital input signals to generate a plurality of digital matrix combined signals, each of the plurality of digital matrix combined signals corresponding to one of the plurality of signal paths; wherein
    the toggling step includes,
        selectively outputting each the plurality of digital matrix combined signals such that only one of the plurality of digital matrix combined signals is output from the digital portion to the analog portion of the signal path during a given buffer capture interval, and
    the calibrating step further includes,
        updating the filter compensation matrix to calibrate the hybrid matrix amplifier.

4. The method of claim 1, wherein, during each buffer capture interval, the generating of the channel estimates further comprises:
    sampling a digital matrix combined signal on the active signal path among the plurality of signal paths;
    generating a plurality of analog matrix combined output signals based on the digital matrix combined signal;
    sampling the analog matrix combined output signals;
    generating the channel estimates based on samples of the digital matrix combined signal and samples of the corresponding analog matrix combined signal, the samples of the digital matrix combined signal and the samples of the corresponding analog matrix combined signal being time-aligned with one another.

5. The method of claim 4, wherein, for each of the plurality of signal paths, the generating of the channel estimates comprises:
    generating a filter compensation matrix including a plurality of compensation filters; and wherein
    the calibrating step calibrates the hybrid matrix amplifier based on the filter compensation matrix.

6. The method of claim 4, wherein the generating step further comprises:
    generating time, gain and phase associated with the first signal path based on a first set of samples of the digital matrix combined signal generated during a first buffer capture interval and a first set of samples of the analog matrix combined output signals generated during a first buffer capture interval; and
    generating a filter compensation matrix including a plurality of compensation filters, the compensation filters being time and phase aligned with one another based on the time, gain and phase associated with the first signal path.

7. The method of claim 1, further comprising:
    filtering a plurality of digital input signals; and
    summing the filtered digital input signals to generate a plurality of digital matrix combined digital signals, each of the plurality of digital matrix combined digital signals corresponding to one of the plurality of signal paths; and wherein
    the toggling step includes,
        selectively outputting the plurality of digital matrix combined signals such that only one of the plurality of digital matrix combined signals is output from the digital portion to the analog portion of the signal path during a given buffer capture interval.

8. The method of claim 1, wherein the toggling step comprises:
    activating, for a first of the buffer capture intervals, a first of the plurality of signal paths;

deactivating, for each subsequent buffer capture interval, the first of the plurality of signal paths; and activating, for each subsequent buffer capture interval, an other of the plurality of signal paths such that each of the plurality of signal paths is active only during a corresponding buffer capture interval.

9. The method of claim 1, wherein the toggling step comprises:

selectively deactivating each of the plurality of signal paths such that only a first of the plurality of signal paths is active during a first buffer capture interval; and selectively activating and deactivating each of the plurality of signal paths during subsequent buffer capture intervals such that only one of the plurality of signal paths is active during each buffer capture interval.

10. The method of claim 1, wherein the toggling step is performed in response to a calibration trigger, the calibration trigger being indicative of variations in characteristics of analog portions of the plurality of signal paths.

11. A hybrid matrix amplifier of a wireless transceiver comprising:

a digital phase combiner configured to toggle between a plurality of signal paths having a digital and an analog portion such that the analog portion of each of the plurality of signal paths is active only during a corresponding buffer capture interval of a calibration process, the signal paths carrying signals to be transmitted by an antenna arrangement, wherein the buffer capture intervals corresponding to each signal path do not overlap; and a matrix compensation estimator configured to generate channel estimates for each of the plurality of signal paths, the channel estimate for each signal path being generated based only on sampling data collected during the corresponding buffer capture interval; wherein the hybrid matrix amplifier is calibrated based on the generated channel estimates.

12. The hybrid matrix amplifier of claim 11, wherein the matrix compensation estimator is further configured to generate a filter compensation matrix including a plurality of compensation filters; and wherein the hybrid matrix amplifier is calibrated based on the generated filter compensation matrix.

13. The hybrid matrix amplifier of claim 11, wherein the digital phase combiner comprises:

a filter bank configured to filter a plurality of digital input signals based on a filter compensation matrix;

a plurality of adders configured to sum the filtered digital input signals to generate a plurality of digital matrix combined signals, each of the plurality of digital matrix combined signals corresponding to one of the plurality of signal paths; and a plurality of multiplexers configured to selectively output each the plurality of digital matrix combined signals such that only one of the plurality of digital matrix combined signals is output from the digital portion to the analog portion of the signal path during a given buffer capture interval.

14. The hybrid matrix amplifier of claim 11, further comprising:

a buffer capture unit configured to capture samples of a digital matrix combined signal on the active signal path among the plurality of signal paths;

an analog hybrid matrix unit configured to generate a plurality of analog matrix combined output signals based on the digital matrix combined signal;

a sampling unit configured to sample the analog matrix combined output signals; and wherein the matrix compensation estimator is configured to generate the channel estimates based on samples of the digital matrix combined signal and samples of the corresponding analog matrix combined signal, the samples of the digital matrix combined signal and the samples of the corresponding analog matrix combined signal being time-aligned with one another.

15. A method of calibrating a hybrid matrix amplifier of a wireless transceiver, the method comprising:

isolating each of a plurality of signal paths having a digital and an analog portion such that the analog portion of each of the plurality of signal paths is active only during a corresponding buffer capture interval of a calibration process, the signal paths carrying signals to be transmitted by an antenna arrangement, wherein the buffer capture intervals corresponding to each signal path do not overlap;

generating channel estimates for each of the plurality of signal paths, the channel estimate for each signal path being generated based only on sampling data collected during the corresponding buffer capture interval; and calibrating the hybrid matrix amplifier based on the generated channel estimates.

* * * * *